US010772247B2

(12) United States Patent
Otsuki et al.

(10) Patent No.: US 10,772,247 B2
(45) Date of Patent: Sep. 8, 2020

(54) TAPE CUTTING PROCESSING APPARATUS AND PROCESSING METHOD

(71) Applicant: FUJI CORPORATION, Chiryu (JP)

(72) Inventors: Takahiro Otsuki, Chiryu (JP); Kenji Shimosaka, Obu (JP)

(73) Assignee: FUJI CORPORATION, Chiryu-shi (JP)

(*) Notice: Subject to any disclaimer, the term of this patent is extended or adjusted under 35 U.S.C. 154(b) by 215 days.

(21) Appl. No.: 15/737,001

(22) PCT Filed: Jun. 18, 2015

(86) PCT No.: PCT/JP2015/067666
§ 371 (c)(1),
(2) Date: Dec. 15, 2017

(87) PCT Pub. No.: WO2016/203628
PCT Pub. Date: Dec. 22, 2016

(65) Prior Publication Data
US 2018/0376630 A1  Dec. 27, 2018

(51) Int. Cl.
H05K 13/02 (2006.01)
B26D 1/30 (2006.01)
(Continued)

(52) U.S. Cl.
CPC ............ *H05K 13/021* (2013.01); *B26D 1/305* (2013.01); *B26D 5/00* (2013.01); *H05K 13/02* (2013.01);
(Continued)

(58) Field of Classification Search
CPC ............... H05K 13/02; H05K 13/0215; H05K 13/0419; H05K 13/021; B26D 5/00; B26D 1/305; B65H 2701/10
See application file for complete search history.

(56) References Cited

U.S. PATENT DOCUMENTS 4,494,902 A * 1/1985 Kuppens ................. H01L 21/67
221/74
4,687,152 A * 8/1987 Hawkswell ........ H05K 13/0417
156/750
(Continued)

FOREIGN PATENT DOCUMENTS

JP  2013-157349 A  8/2013
WO  2014/097473 A1  6/2014

OTHER PUBLICATIONS

International Search Report dated Sep. 29, 2015 in PCT/JP2015/067666 filed Jun. 18, 2015.

*Primary Examiner* — Thanh K Truong
*Assistant Examiner* — Thomas M Wittenschlaeger
(74) *Attorney, Agent, or Firm* — Oblon, McClelland, Maier & Neustadt, L.L.P.

(57) ABSTRACT

A tape cutting processing apparatus includes a conveyance device conveying a component wrapping tape along a conveyance path, a detection device detecting the presence of a component accommodated in a cavity of the component wrapping tape conveyed along the conveyance path at a detection position, a folding-back member that folds back a cover tape at a folding-back position so that adhesion surfaces of the cover tape face each other as the component wrapping tape is conveyed, a cutting device that cuts each cutting portion of a carrier tape and the cover tape at a cutting position, and a control device that the conveyance device to position the carrier tape and the cover tape folded back by the folding-back member in a state of being overlapped on the cutting position, and controls the cutting device to cut the carrier tape and the cover tape.

6 Claims, 17 Drawing Sheets

(51) Int. Cl.
  *B26D 5/00* (2006.01)
  *H05K 13/04* (2006.01)
(52) U.S. Cl.
  CPC ..... *H05K 13/0215* (2018.08); *H05K 13/0419*
       (2018.08); *B65H 2701/10* (2013.01)

(56) References Cited

U.S. PATENT DOCUMENTS

| | | | | |
|---|---|---|---|---|
| 4,735,341 | A * | 4/1988 | Hamilton | H05K 13/0417 |
| | | | | 221/1 |
| 4,740,136 | A * | 4/1988 | Asai | H01L 21/6838 |
| | | | | 221/74 |
| 4,820,369 | A * | 4/1989 | Kubo | H05K 13/0419 |
| | | | | 156/716 |
| 4,869,393 | A * | 9/1989 | Soth | H05K 13/003 |
| | | | | 221/1 |
| 4,915,770 | A * | 4/1990 | Haeda | B65B 69/00 |
| | | | | 156/716 |
| 4,923,089 | A * | 5/1990 | Hineno | H05K 13/0419 |
| | | | | 221/1 |
| 4,952,113 | A * | 8/1990 | Fujioka | H05K 13/0419 |
| | | | | 414/416.08 |
| 5,116,454 | A * | 5/1992 | Kurihara | H05K 13/0417 |
| | | | | 156/701 |
| 5,191,693 | A * | 3/1993 | Umetsu | B23P 19/001 |
| | | | | 156/324 |
| 5,454,900 | A * | 10/1995 | Han | B29C 63/0013 |
| | | | | 156/765 |
| 5,992,791 | A * | 11/1999 | Tsuda | H05K 13/0419 |
| | | | | 242/535.3 |
| 6,402,452 | B1 * | 6/2002 | Miller | H05K 13/0417 |
| | | | | 156/751 |
| 6,926,797 | B2 * | 8/2005 | Okawa | H05K 13/0419 |
| | | | | 156/701 |
| 7,713,376 | B2 * | 5/2010 | Larsson | H05K 13/0419 |
| | | | | 156/714 |
| 8,353,424 | B2 * | 1/2013 | Ikeda | H05K 13/0419 |
| | | | | 221/25 |
| 9,674,995 | B2 * | 6/2017 | Yanagida | H05K 13/0419 |
| 9,736,970 | B2 * | 8/2017 | Kanda | H05K 13/0417 |
| 2003/0049109 | A1 * | 3/2003 | Yman | H05K 13/02 |
| | | | | 414/403 |
| 2015/0189801 | A1 * | 7/2015 | Yanagida | H05K 13/0419 |
| | | | | 221/25 |
| 2015/0195963 | A1 * | 7/2015 | Kitani | H05K 13/02 |
| | | | | 156/701 |
| 2018/0148289 | A1 * | 5/2018 | Oyama | H05K 13/0419 |

\* cited by examiner

TAPE CUTTING PROCESSING APPARATUS AND PROCESSING METHOD

TECHNICAL FIELD

The present disclosure relates to a tape cutting processing apparatus and a processing method for performing automatic cutting processing a leading end of a component wrapping tape to be capable of setting in a tape feeder.

BACKGROUND ART

A component mounting machine is used as an apparatus for mounting an electronic component on a circuit board to produce an electronic circuit product. A tape feeder, on which a tape reel around which a component wrapping tape is wound is mounted, is detachably mounted on the component mounting machine. The component wrapping tape is constituted by causing a cover tape to adhere a carrier tape accommodating the electronic components at regular intervals.

In a case where the component wrapping tape is set in the tape feeder, in general, the component wrapping tape drawn out from the tape reel is cut so that a leading end of the cover tape protrudes by a predetermined protruding length from a leading end of the carrier tape. In PTL 1, an automatic tape processing device, which automatically cuts a carrier tape and a cover tape so that a leading end of the cover tape protrudes by a predetermined protruding length from a leading end of the carrier tape, is disclosed. There is no need to perform tape cutting work by an operator and it is possible to greatly improve the efficiency in setting a component wrapping tape in a tape feeder by realizing the device disclosed in PTL 1.

CITATION LIST

Patent Literature

PTL 1: WO2014/097473

SUMMARY

However, the device disclosed in PTL 1 is effective in that the carrier tape and the cover tape can be automatically cut so that the leading end of the cover tape protrudes by the predetermined protruding length from the leading end of the carrier tape, but the carrier tape and the cover tape are required to be separately cut by a cutting device and there is a problem that shortening of a time required for cutting processing is limited.

The present disclosure is made in view of the above-described problem and an object of the present disclosure is to provide a tape cutting processing apparatus and a processing method in which a cover tape and a carrier tape are capable of being processed by cutting at once so that a leading end of the cover tape protrudes by a predetermined protruding length from a leading end of the carrier tape.

In order to solve the program, a characteristic of the disclosure is that a tape cutting processing apparatus which performs cutting processing so that a leading end of a cover tape of a component wrapping tape, which is capable of being wound around a tape reel mounted on a tape feeder, protrudes by a predetermined protruding length from a leading end of a carrier tape, the cover tape being adhered on an upper face side of the carrier tape provided with cavities accommodating components at fixed pitches. The tape cutting processing apparatus includes a conveyance device that conveys the component wrapping tape along a conveyance path; a detection device that detects the presence or absence of the component accommodated in the cavity of the component wrapping tape conveyed along the conveyance path at a detection position disposed on the conveyance path; a folding-back member that folds back the cover tape at a folding-back position so that adhesion surfaces of the cover tape face each other as the component wrapping tape is conveyed; a cutting device that cuts each cutting portion of the carrier tape and the cover tape at a cutting position disposed on the conveyance path; and a control device that controls each operation of the conveyance device and the cutting device. The control device controls the conveyance device based on a detection signal from the detection device to position the carrier tape and the cover tape folded back by the folding-back member in a state of being overlapped on the cutting position, and controls the cutting device to cut the carrier tape and the cover tape.

According to the disclosure, the carrier tape and the cover tape folded back by the folding-back member are positioned by controlling the conveyance device in a state of being overlapped on the cutting position, and the carrier tape and the cover tape are cut by controlling the cutting device. Therefore, it is possible to cut the carrier tape and the cover tape at once by the cutting device so that the leading end of the cover tape protrudes by a predetermined protruding length from the leading end of the carrier tape, and it is possible to effectively perform the cutting processing of the tape.

DESCRIPTION OF EMBODIMENTS

Hereinafter, a tape cutting processing apparatus according to an embodiment of the disclosure will be described with reference to the drawings. First, a configuration of an automatic tape setting apparatus including the tape cutting processing apparatus will be described with reference to FIG. 1.

Figure 2:
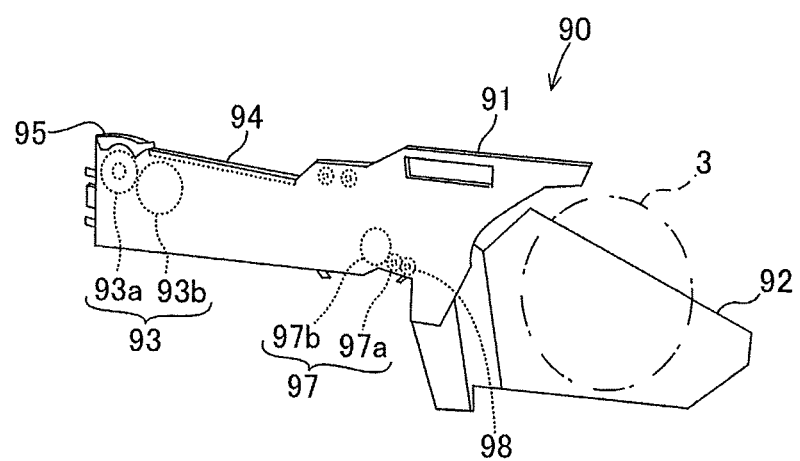
FIG. 2 is a perspective view illustrating a tape feeder in which a component wrapping tape is set.
Figure 3:
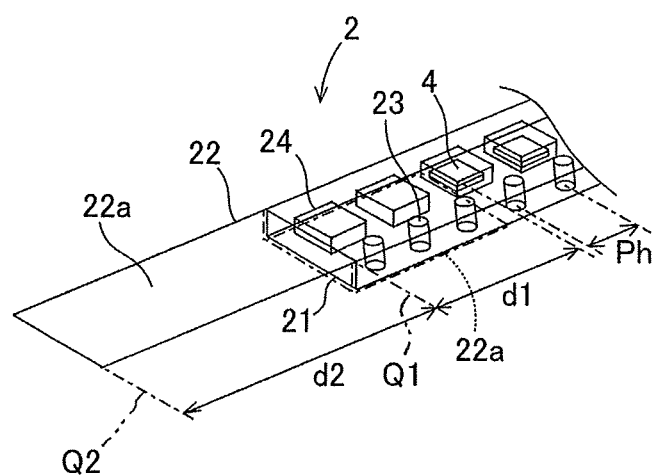
FIG. 3 is a perspective view illustrating the component wrapping tape.

An automatic tape setting apparatus 1 is an apparatus which automatically sets a component wrapping tape 2 illustrated in FIG. 3 to a tape feeder 90 illustrated in FIG. 2. More specifically, the automatic tape setting apparatus 1 is an apparatus which performs cutting processing of a leading end of a carrier tape 21 of the component wrapping tape 2 wound around a tape reel 3 which is mounted on the tape feeder 90 by a tape cutting processing apparatus, and then sets the carrier tape 21 to a pitch feeding mechanism section 93 of the tape feeder 90, and sets a cover tape 22 to a cover tape feeding mechanism section 97 by being handled in a predetermined path.

Moreover, in the following description, with reference to the tape conveyance direction for drawing out the component wrapping tape 2 from the tape reel 3 when the component wrapping tape 2 is set to the tape feeder 90, a horizontal direction orthogonal to the tape conveyance direction is referred to as an X-direction, a horizontal direction parallel to the tape conveyance direction is referred to as a Y-direction, and a vertical direction orthogonal to the X-direction and the Y-direction is referred to as a Z-direction.

As illustrated in FIG. 2, a reel accommodation section 92 capable of accommodating the tape reel 3 around which the component wrapping tape 2 is wound is provided on a tail end side (right side in FIG. 2) of a feeder main body 91 of the tape feeder 90 to which the component wrapping tape 2 is set. The pitch feeding mechanism section 93, which pitch-feeds the component wrapping tape 2 drawn out from the tape reel 3, is provided on a front end side (left side in FIG. 2) of the feeder main body 91. In addition, a tape feeding guide 94, which guides the pitch-fed component wrapping tape 2, is provided between the reel accommodation section 92 and the pitch feeding mechanism section 93 at an upper face portion of the feeder main body 91.

The pitch feeding mechanism section 93 includes a sprocket 93a, a motor 93b which drives the sprocket 93a to rotate, and the like. In addition, the pitch feeding mechanism section 93 is provided with a tape holding section 95 which holds the component wrapping tape 2 so that the pitch-fed component wrapping tape 2 is not detached from the pitch feeding mechanism section 93.

The tape holding section 95 is formed with an opening (not illustrated) for taking out a component accommodated in the component wrapping tape 2 at a component suction position. The tape feeder 90 pulls and peels off the cover tape 22 from the carrier tape 21 by a tape peeling section (not illustrated) while holding the component wrapping tape 2 by the tape holding section 95.

In addition, the cover tape feeding mechanism section 97, which delivers the cover tape 22 which is pulled and peeled off by the tape peeling section in a direction opposite to a pitch feed direction of the component wrapping tape 2, is provided at a center lower portion of the feeder main body 91. The cover tape feeding mechanism section 97 includes a gear 97a, a motor 97b which drives the gear 97a to rotate, and the like. The cover tape feeding mechanism section 97 is provided with a tape holding section 98 which holds the cover tape 22 so that the delivered cover tape 22 is not detached from the cover tape feeding mechanism section 97.

As illustrated in FIG. 3, the component wrapping tape 2 is configured of the carrier tape 21 where components 4 are accommodated within cavities 24 formed at predetermined pitches, and the cover tape 22 which adheres an upper face of the carrier tape 21 and covers the components 4. Feeding holes 23, which are capable of engaging with the sprockets 93a of the pitch feeding mechanism section 93, are perforated at an edge portion of the component wrapping tape 2 on one side in a width direction at fixed pitches Ph. Therefore, the sprocket 93a of the pitch feeding mechanism section 93 is rotated so that the component wrapping tape 2 is pitch-fed while teeth of the sprocket 93a are sequentially fitted into the feeding holes 23.

In addition, prior to setting the component wrapping tape 2 on the tape feeder 90, the component wrapping tape 2 is cutting-processed so that a leading end of the cover tape 22 protrudes by a predetermined protruding length from a leading end of the carrier tape 21 by a tape cutting processing apparatus having a configuration which is described later. That is, as illustrated in FIG. 3, the carrier tape 21 is cutting-processed so that a distance from a leading end thereof to a leading component 4 is d1, and the cover tape 22 is cutting-processed so that a length of a protruding section 22a protruding from the carrier tape 21 is d2.

Figure 1:
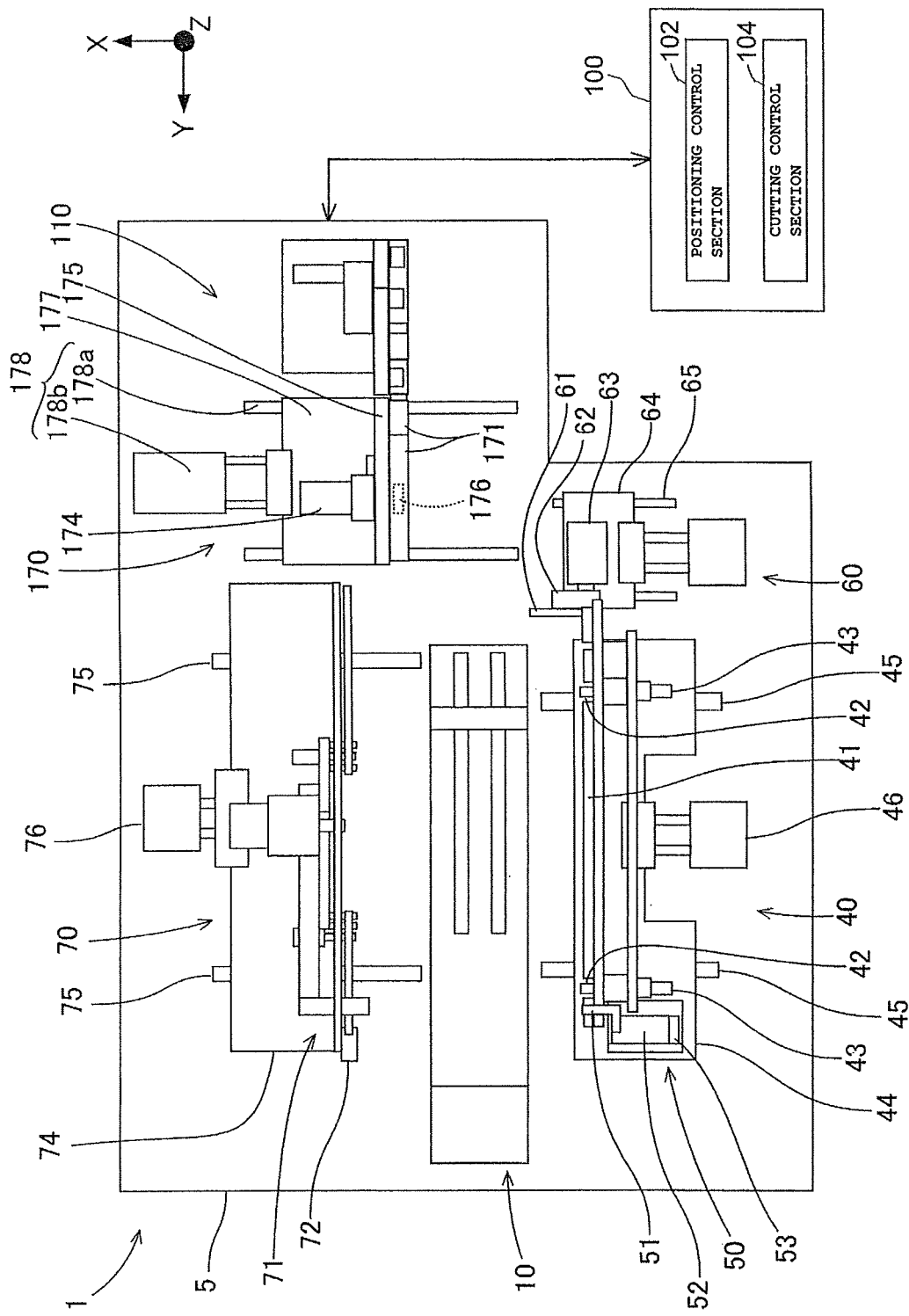
FIG. 1 is a plan view illustrating an outline of an automatic tape setting apparatus including a tape cutting processing apparatus according to an embodiment of the disclosure.

As illustrated in FIG. 1, the automatic tape setting apparatus 1 is configured to include a feeder holding stand 10 that is capable of holding the tape feeder 90, a tape cutting processing apparatus 110 that cutting-processes a leading end of the component wrapping tape 2, a tape transfer device 40 that conveys the component wrapping tape 2 which is processed by the tape cutting processing apparatus 110, to the tape feeder 90, first and second release devices 50 and 60 that respectively release holding of the tape by the tape holding sections 95 and 98 (see FIG. 2) of the tape feeder 90, a cover tape loading device 70 that loads the cover tape 22, a transfer device 170 that transfers the component wrapping tape 2 which is cut by the tape cutting processing apparatus 110, to the tape transfer device 40, a control device 100 that controls an operation of each device, and the like.

The transfer device 170 includes a guide 171 that guides the component wrapping tape 2 which is cut by a cutting device 160 and conveyed, driving roller and driven roller (not illustrated) that are disposed in the guide 171, a gear motor 174 that drives the driving roller to rotate, an air cylinder 176 that lifts and lowers a support plate 175 on which the guide 171 and the gear motor 174 are disposed and supported, a seat 177 to which the air cylinder 176 is disposed and fixed, a moving device 178 that is configured of a pair of rails 178a and an air cylinder 178b, which moves the seat 177 in the X-direction, and the like.

The tape transfer device 40 includes a guide 41 that guides the component wrapping tape 2 in the Y-direction, two driving rollers 42 that are disposed in the Y-direction, two gear motors 43 that drive each of the driving rollers 42 to rotate, and the like. The tape transfer device 40 is placed and fixed to a seat 44 via a support plate (not illustrated). The seat 44 of the tape transfer device 40 is capable of moving in the X-direction by rails 45 and an air cylinder 46 having the same configuration as that of the moving device 178 of the transfer device 170. The tape transfer device 40 and the transfer device 170 are capable of approaching or retracting to sandwich the tape feeder 90 held by the feeder holding stand 10 from the X-direction.

When the tape feeder 90 is held by the feeder holding stand 10 and the tape transfer device 40 and the transfer device 170 approach the tape feeder 90, the conveyed component wrapping tape 2 is guided through the guide 171 of the transfer device 170, and further guided through a gap between the guide 41 of the tape transfer device 40 and the tape feeding guide 94 of the tape feeder 90.

The first release device 50 includes a first lift lever 51 that is capable of moving a lever (not illustrated) of the tape holding section 95 in the Z-direction, a support table 52 that is supported so that a leading end of the first lift lever 51 protrudes on a tape feeder 90 side, an air cylinder 53 that is fixed to the seat 44 of the tape transfer device 40 via a support plate (not illustrated) so that the support table 52 is capable of moving in the Z-direction, and the like.

The second release device 60 includes a second lift lever 61 that is capable of moving a lever (not illustrated) of the second tape holding section 98 in the Y-direction, a support table 62 that is supported so that a leading end of the second lift lever 61 protrudes on the tape feeder 90 side, an air cylinder 63 that is capable of moving the support table 62 in the Y-direction, and the like. The air cylinder 63 is placed and fixed to a seat 64 which is disposed to be capable of sliding on a pair of rails 65 in the X-direction.

The cover tape loading device 70 is disposed on a base 5 on a side on which the cover tape feeding mechanism section 97 of the tape feeder 90 held by the feeder holding stand 10 is exposed. The cover tape loading device 70 is configured to include a path forming device 71, a connecting device 72, and the like, and the path molding device 71 is placed and fixed to a seat 74 via a support plate (not illustrated). The seat 74 of the cover tape loading device 70 is disposed on a pair of rails 75 provided to extend in the X-direction with a predetermined interval on the base 5 to be capable of sliding in the X-direction, and is slid by an air cylinder 76 in the X-direction. In addition, a temporary tape (not illustrated) is molded in advance and is held in the cover tape loading device 70 in a shape following the conveyance path of the cover tape 22.

Moreover, except for the tape cutting processing apparatus 110, the configurations of the feeder holding stand 10, the tape transfer device 40, the first and second release devices 50 and 60, the cover tape loading device 70, and the transfer device 170 are the same as those described in WO2014/097473 relating to the application of the present applicant, and the same configurations can be used. Therefore, detailed description will be omitted.

Figure 4:
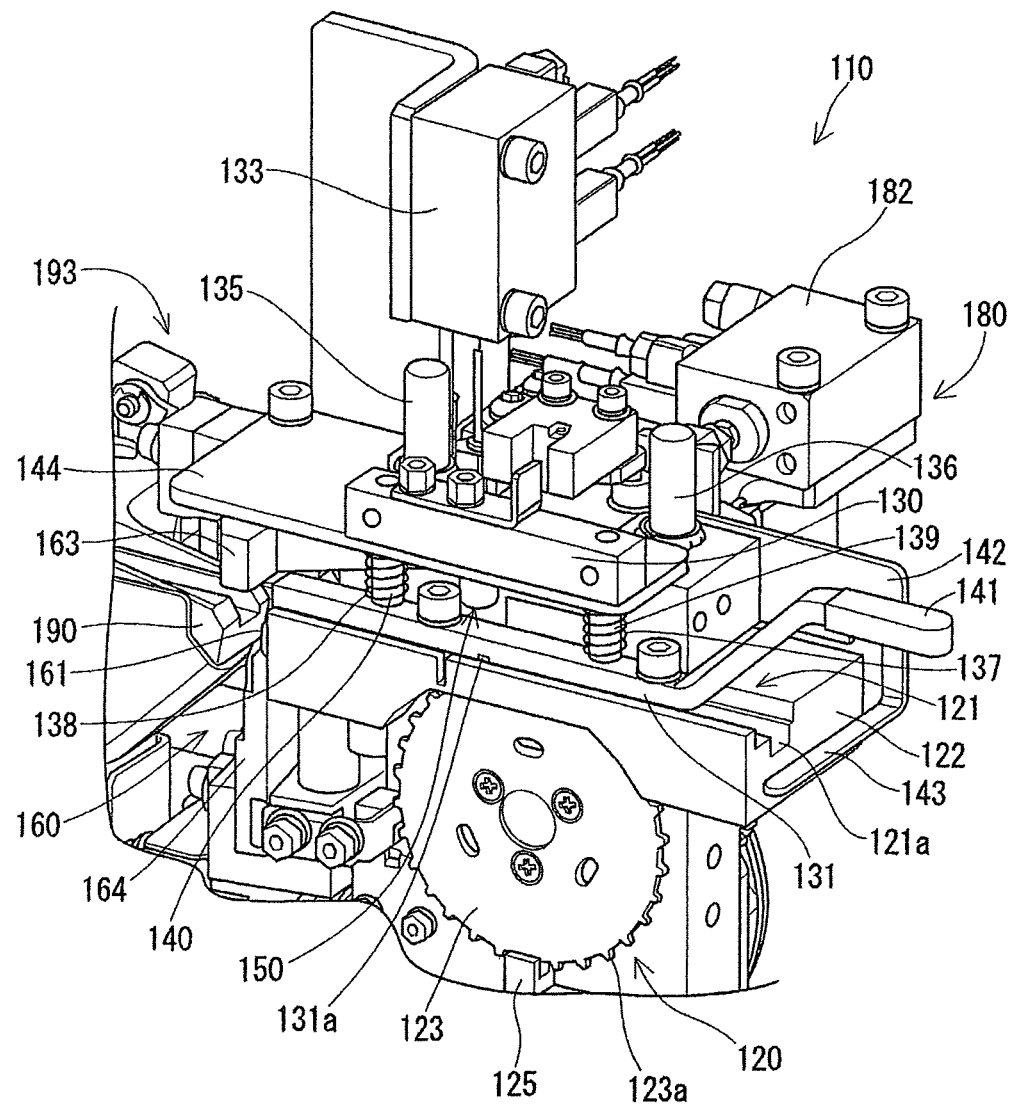
FIG. 4 is a perspective view illustrating the tape cutting processing apparatus according to the embodiment of the disclosure.
Figure 6:
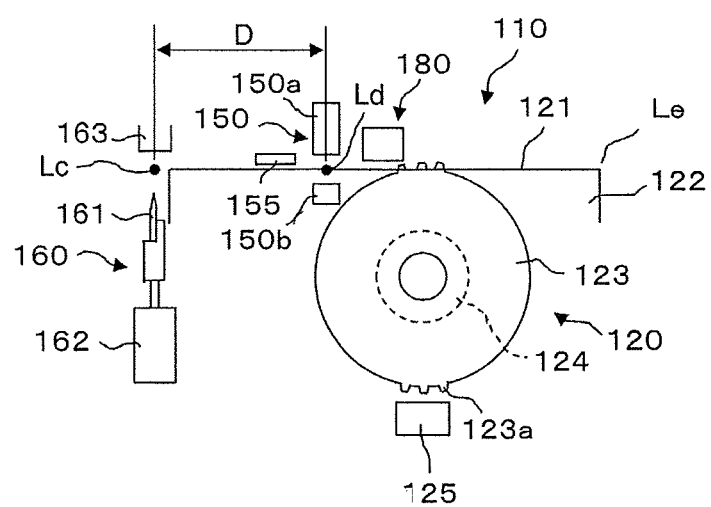
FIG. 6 is a schematic diagram illustrating a positional relationship between a detection position at which a detection device is provided and a cutting position at which the cutting device is provided.

As illustrated in FIG. 1, the tape cutting processing apparatus 110 is disposed at a rear position (right side of FIG. 1) of the tape feeder 90 held by the feeder holding stand 10 on the base 5 by being offset by a predetermined amount in the X-direction. As illustrated in FIGS. 4 and 6, the tape cutting processing apparatus 110 is configured to include a conveyance device 120 that conveys (pitch-feeds) the component wrapping tape 2 along the conveyance path 121 which is formed in a conveyance block 122, a detection device 150 that detects the cavity 24 of the component wrapping tape 2 and the component 4 accommodated in the cavity 24 which are conveyed along a conveyance path 121, at a detection position Ld disposed on the conveyance path 121, a peeling member 155 that peels off the cover tape 22 from the carrier tape 21 of the component wrapping tape 2 conveyed along the conveyance path 121, the cutting device 160 that cuts each of cutting portions Q1 and Q2 (see FIG. 3) of the carrier tape 21 and the cover tape 22 at a cutting position Lc disposed on the conveyance path 121, and the like.

The conveyance device 120 includes a sprocket 123 that is disposed below the conveyance path 121 of the conveyance block 122 conveying the component wrapping tape 2, a motor 124 that is connected to the sprocket 123, a sprocket tooth detection device 125 that is disposed in the vicinity of the sprocket 123, and the like. The conveyance path 121 is formed with a guide groove 121a that extends straight from an insertion port Le of the conveyance block 122 to an exit and the component wrapping tape 2 which is guided by the guide groove 121a is conveyed. The conveyance device 120 conveys the component wrapping tape 2 along the conveyance path 121 and is configured so as to position the cutting portion Q1 of the carrier tape 21 at the cutting position Lc.

A multiple of teeth 123a having the same pitch as the pitch Ph (see FIG. 3) of the feeding hole 23 is formed in the sprocket 123 in a circumferential direction to be capable of engaging with the feeding hole 23 of the carrier tape 21. The sprocket 123 is disposed below the conveyance path 121 so that the tooth 123a which is rotated at the uppermost portion of the rotating teeth 123a can be engaged with the feeding hole 23 of the component wrapping tape 2.

The motor 124 for rotating the sprocket 123 is configured of a motor, for example, a stepping motor capable of positioning control of the cutting portion Q1 of the carrier tape 21 of the component wrapping tape 2 conveyed by the sprocket 123, at the cutting position Lc. The sprocket tooth detection device 125 is, for example, a photosensor and detects that one of the teeth 123a of the sprocket 123 faces vertically upward, that is, the sprocket 123 is in an original position by reading a mark attached to a side face of the sprocket 123.

Figure 5:
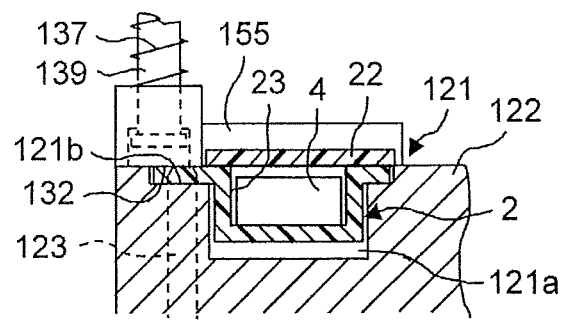
FIG. 5 is a sectional view illustrating a conveyance path of the tape cutting processing apparatus.

A lifting and lowering block 130 is guided so as to be capable of lifting and lowering by a pair of guide shafts 135 and 136 on the conveyance block 122 and is lifted and lowered by an air cylinder 133 which is disposed in a fixing section by a predetermined amount. A pushing member 131, which pushes the component wrapping tape 2 conveyed along the conveyance path 121, toward a conveyance reference surface 121b (see FIG. 5) of the conveyance path 121, is held to be capable of vertically moving and inclining, and is pushed downward by a biasing force of a pair of biasing members (springs) 137 and 138 in the lifting and lowering block 130.

Specifically, a pair of guide bars 139 and 140 parallel to each other protrudes downward in the lifting and lowering block 130, and the pushing member 131 is engaged and held at a lower portion of the pair of guide bars 139 and 140 to be capable of lifting and lowering, and inclining. The pair of biasing members 137 and 138 wound around the pair of guide bars 139 and 140 respectively is interposed between the lifting and lowering block 130 and the pushing member 131. In the biasing force of the pair of biasing members 137 and 138, the biasing force of the biasing member 137 disposed on the upstream side in the tape conveyance direction is set to be larger than the biasing force of the biasing member 138 disposed on the downstream side in the tape conveyance direction.

A pushing section 132 (see FIG. 5), which pushes the component wrapping tape 2 conveyed along the conveyance path 121, against the conveyance reference surface 121b, is provided on a lower face of the pushing member 131 on the upstream side in the tape conveyance direction. In addition, the peeling member 155 (see FIGS. 6 and 10), which has a scraper 155*a* at a leading end for peeling off the cover tape 22 from the carrier tape 21, is provided on the lower face of the pushing member 131 on the downstream side in the tape conveyance direction. The peeling member 155 also functions as a folding-back member that folds the cover tape 22 peeled off from the carrier tape 21 at a folding-back position Lt so that the adhesion surfaces face each other.

An operation lever 141 which is lifted up by an operator is provided at one end of the pushing member 131. The operation lever 141 is lifted up when the component wrapping tape 2 is inserted from the insertion port Le of the conveyance block 122. Therefore, the pushing member 131 is lifted up against the biasing force of the biasing members 137 and 138, and the component wrapping tape 2 can be inserted into the conveyance path 121.

A lifting member 143, which lifts up the component wrapping tape 2 from the conveyance path 121 at the insertion port Le and the exit of the conveyance path 121, is attached to a member 142 which integrally lifts and lowers with the lifting and lowering block 130. The lifting member 143 is positioned below the conveyance path 121 in a state where the lifting and lowering block 130 is lowered, but if the lifting and lowering block 130 is lifted, the lifting member 143 is positioned above the conveyance path 121. Therefore, after the carrier tape 21 and the cover tape 22 of the component wrapping tape 2 are cut, the component wrapping tape 2 can be separated from the guide groove 121*a* of the conveyance path 121 by the lifting member 143.

Figure 10:
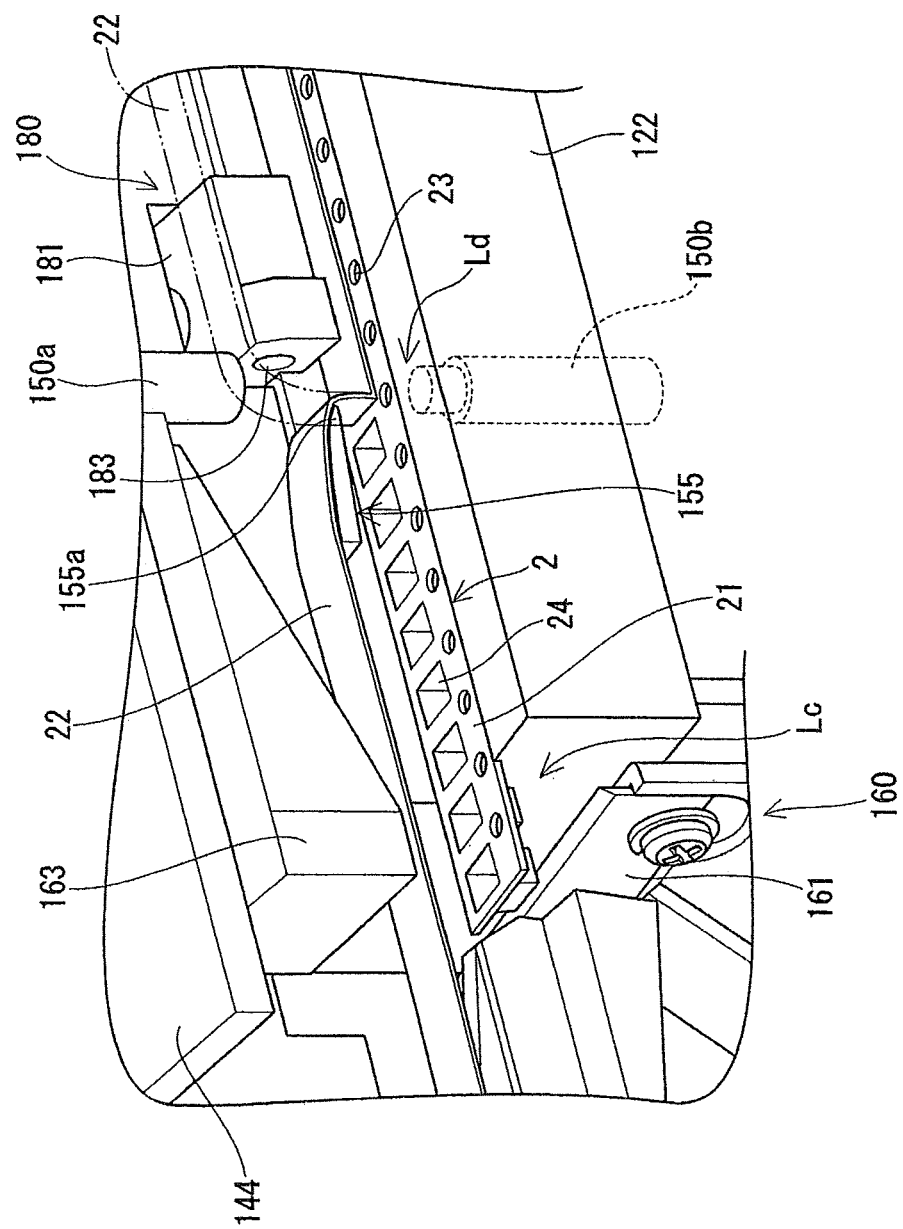
FIG. 10 is a view illustrating a state where a cover tape is peeled off from a carrier tape.

For example, as illustrated in FIGS. 6 and 10, the detection device 150 is configured of a pair of photosensors 150*a* and 150*b* disposed to face each other at the detection position Ld with the conveyance path 121 interposed therebetween, and detects the cavity 24 of the component wrapping tape 2 conveyed along the conveyance path 121, the tape portion between the cavities 24, and the component 4 within the cavity 24 by a change in a light amount. Moreover, a camera may be used instead of the photosensor.

Figure 11:
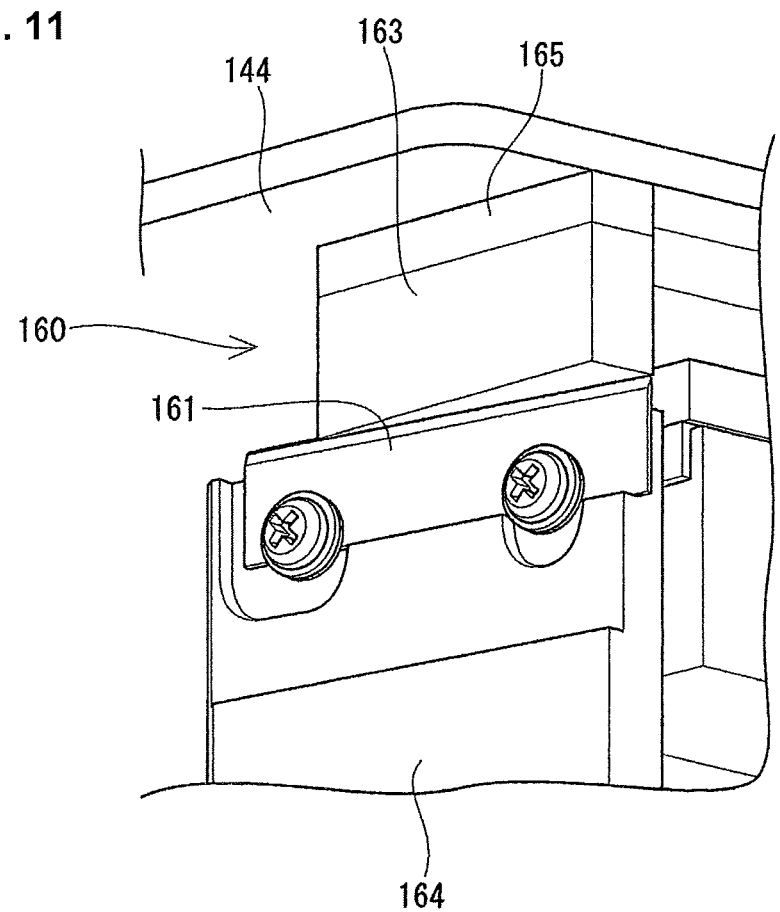
FIG. 11 is a view illustrating the cutting device that cuts the carrier tape and the cover tape.

As illustrated in FIGS. 6 and 11, the cutting device 160 is provided at the cutting position Lc provided corresponding to the exit of the conveyance path 121. The cutting device 160 is configured of a cutter 161, an air cylinder 162 which lifts and lowers the cutter 161, a cutter receiving table 163 against which a cutting edge of the cutter 161 is pushed, and the like. Moreover, the cutter 161 may be lifted and lowered by driving of a motor. The cutter 161 is detachably and replaceably fixed to an upper end of a cutter holding body 164 which is supported on a fixing section to be capable of lifting and lowering. The cutter receiving table 163 is made of a resin material so that the cutting edge of the cutter 161 does not wear, and is fixed to a lower face of a supporting plate 144, which is integral with the lifting and lowering block 130, via an elastic body 165 such as a rubber sheet or the like which absorbs a pushing force of the cutter 161. The cutter 161 includes the cutting edge of which a leading end having a wider width than a width of the component wrapping tape 2 is sharp, and is pushed so that no gap is generated in the cutter receiving table 163.

The cutter 161 is moved upward by the air cylinder 162 in order to cut each of the cutting portions Q1 and Q2 of the carrier tape 21 and the cover tape 22 which are positioned at the cutting position Lc in the conveyance path 121. It is possible to reliably cut the cover tape 22 by the cutting device 160 having such a configuration even if the cover tape 22 is formed of a thin resin film.

Figure 9:
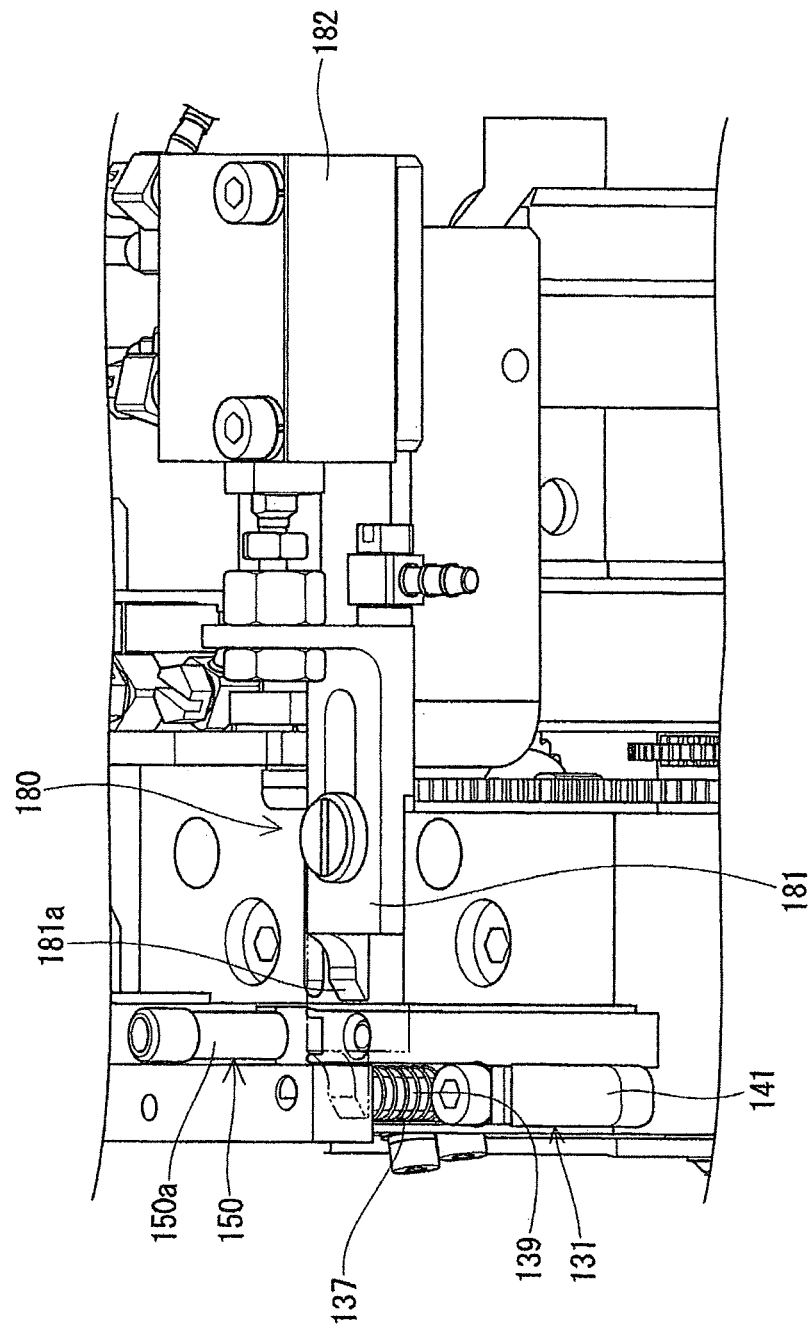
FIG. 9 is a perspective view illustrating an air blow device.

An air blow device 180 illustrated in FIG. 9 is disposed between the pair of guide bars 139 and 140. The air blow device 180 includes an air blow main body 181 which is capable of advancing and retracting in a direction orthogonal to the conveyance path 121, and the air blow main body 181 is advanced and retracted by an air cylinder 182. An air blow hole 183 (see FIG. 10) ejecting a pressurized air to the downstream side in the tape conveyance direction is opened in the air blow main body 181 and the air blow hole 183 is connected to a pressurized air supply source via a switching valve (not illustrated). The leading end of the cover tape 22 peeled off from the carrier tape 21 is pushed by the pressurized air ejected from the air blow hole 183 along the upper face of the peeling member 155 disposed on the downstream side thereof.

In addition, a leading end of the air blow main body 181 is formed of a lifting section 181*a* which lifts up the pushing member 131 against the biasing force of the biasing members 137 and 138 by engaging with an engaging recessed section 131*a* (see FIG. 4) formed on the lower face of the pushing member 131. Normally, the lifting section 181*a* is held at a position retreated with respect to the pushing member 131, but the lifting section 181*a* is advanced to a position where the pushing member 131 is engaged with the lifting section 181*a* by the air cylinder 182, and the pushing member 131 is lifted up when the carrier tape 21 is cut.

In this case, in the biasing forces of the biasing members 137 and 138 wound around the pair of guide bars 139 and 140, the biasing force of the biasing member 137 which is positioned on the upstream side in the tape conveyance direction is larger than that of the biasing member 138. Therefore, the pushing member 131 is inclined by the engagement with the lifting section 181*a* so that the upstream side in the tape conveyance direction is lowered with an engagement point with the lifting section 181*a* as a fulcrum. Therefore, while a pushing operation of the carrier tape 21 is maintained by the pushing section 132 provided on the upstream side of the pushing member 131 in the tape conveyance direction, the peeling member 155 provided on the downstream side of the pushing member 131 in the tape conveyance direction is lifted and is separated from the upper face of the carrier tape 21. The peeling operation of the cover tape 22 by the peeling member 155 is not performed due to the lifting of the peeling member 155.

Furthermore, even when the peeling member 155 is lifted, the pushing operation of the carrier tape 21 is maintained by the pushing section 132. Therefore, the feeding hole 23 of the carrier tape 21 is not separated from the sprocket 123 of the conveyance device 120. The pushing section 132 and the peeling member 155 can be provided in the common pushing member 131 without being separated by such a configuration, so that the number of components can be reduced.

Figure 13:
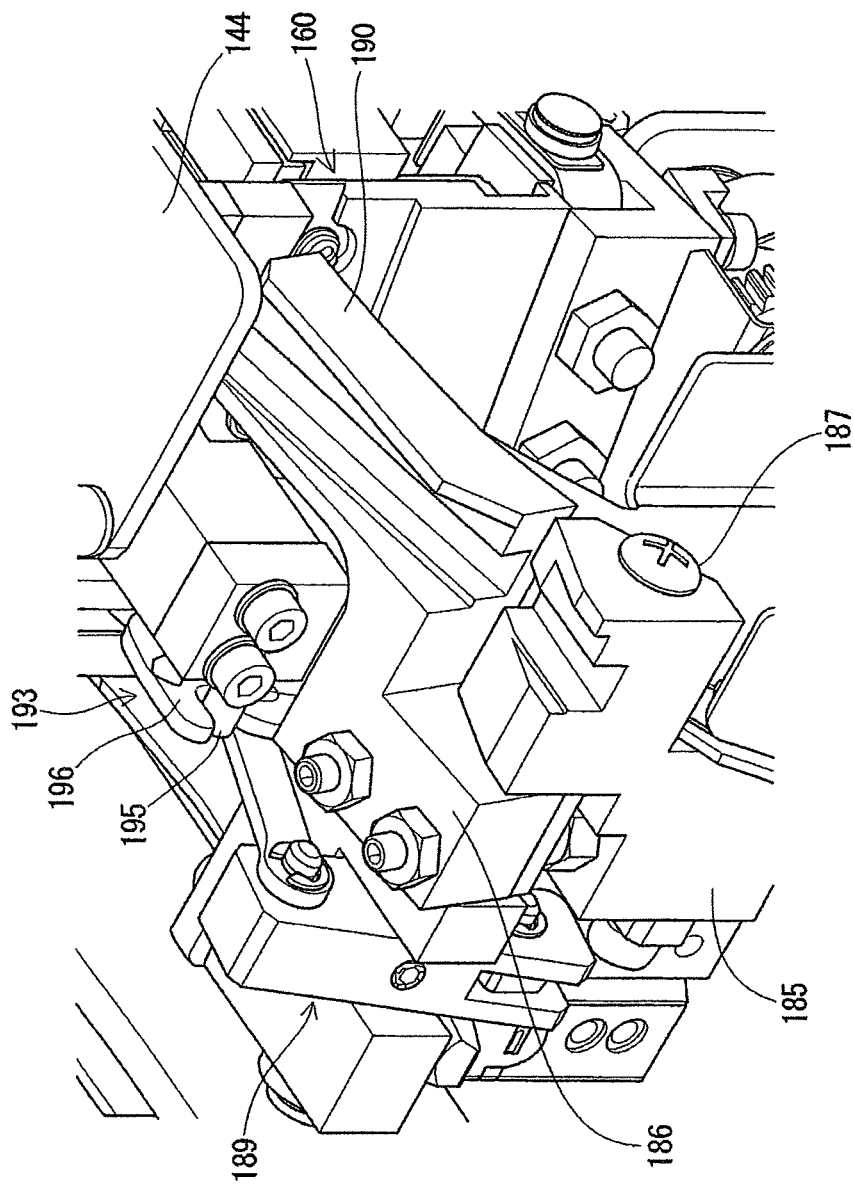
FIG. 13 is a view illustrating a lock mechanism that mechanically locks lifting and lowering of a lifting and lowering block.
Figure 14:
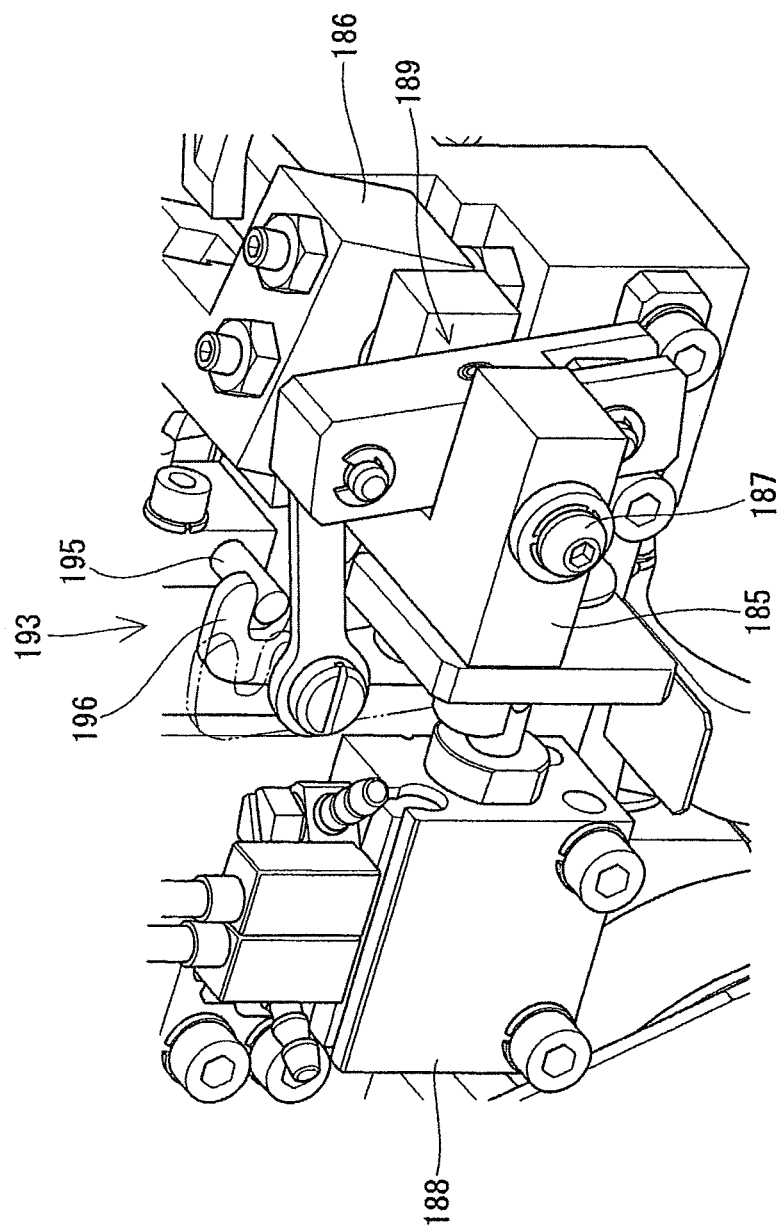
FIG. 14 is a view illustrating the lock mechanism as viewed from a direction different from that of FIG. 13.

As illustrated in FIGS. 13 and 14, a rotating member 186 is rotatably supported around a horizontal shaft 187 on a support table 185 fixed to the fixing section corresponding to the exit of the conveyance block 122 in the conveyance path 121, that is, the cutting position Lc. The rotating member 186 is connected to a link mechanism 189 which is rotated by an air cylinder 188 and the rotating member 186 is rotated by a predetermined angle by the air cylinder 188. The rotating member 186 is integrally provided with a guide member 190 that guides each of the leading end portions of the carrier tape 21 and the cover tape 22 which are cut by the cutting device 160 to a discard position. When the carrier tape 21 and the cover tape 22 are cut, the guide member 190 is held at an angle position illustrated in FIG. 13 so that each of the leading end portions of the carrier tape 21 and the cover tape 22 can be guided to the discard position.

The supporting plate 144 integrally formed with the lifting and lowering block 130 is provided with a lock mechanism 193 for mechanically locking up lifting and lowering of the lifting and lowering block 130 (supporting plate 144). When the carrier tape 21 and the cover tape 22 are cut by the cutting device 160, the lock mechanism 193 receives a cutting load applied to the supporting plate 144 to which the cutter receiving table 163 is attached and suppresses displacement of the lifting and lowering block 130 (supporting plate 144) due to the cutting load.

The lock mechanism 193 is configured of an engaging pin 195 which is supported by the supporting plate 144 and an engaging hook 196 which is integrally attached to the link mechanism 189 and is capable of engaging with the engaging pin 195. Normally, the engaging hook 196 is separated from the engaging pin 195 (see two-dotted chain line of FIG. 14) and lifting and lowering of the lifting and lowering block 130 is allowed. However, as the guide member 190 is provided in conjunction with the rotation to the angle position for guiding the carrier tape 21 and the cover tape 22 to the discard position, as indicated by a solid line of FIG. 14, the engaging hook 196 is positioned at a lock position engaging with the engaging pin 195.

As illustrated in FIG. 1, the control device 100 includes a positioning control section 102 that positioning-controls the cutting portion Q1 of the carrier tape 21 at the cutting position Lc by controlling the motor 124 of the conveyance device 120 based on a detection signal from the detection device 150, a cutting control section 104 that controls the cutting device so as to simultaneously cut the carrier tape 21 and the cover tape 22 in a state where the carrier tape 21 and the cover tape 22 are positioned to be overlapped at the cutting position Lc, and the like.

Figure 17:
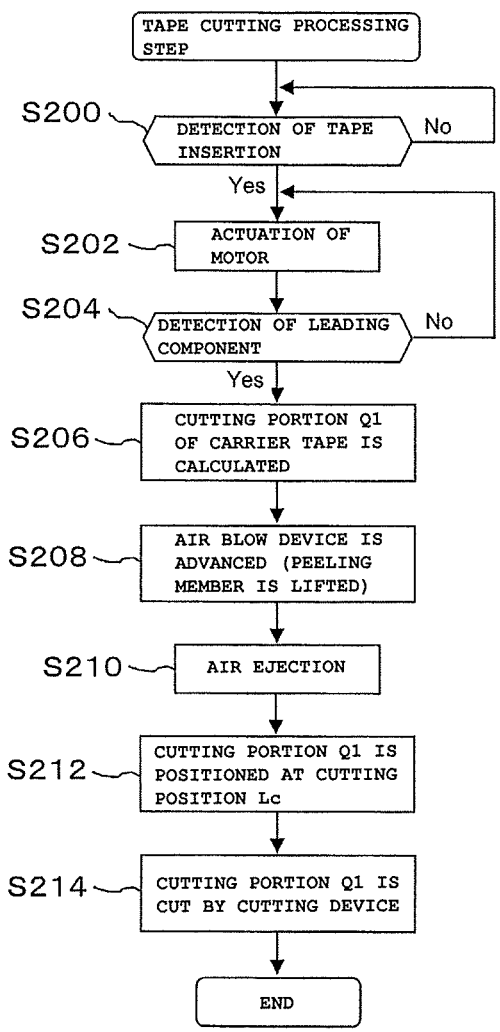
FIG. 17 is a flowchart illustrating an operation of tape cutting processing.

Next, an operation of the tape cutting processing apparatus 110, which cuts the carrier tape 21 and the cover tape 22 at once so that in the component wrapping tape 2 inserted from the insertion port Le of the conveyance block 122, the leading end of the cover tape 22 protrudes by a predetermined protruding length d2 (see FIG. 3) from the leading end of the carrier tape 21, will be described with reference to a flowchart of FIG. 17.

Figure 7:
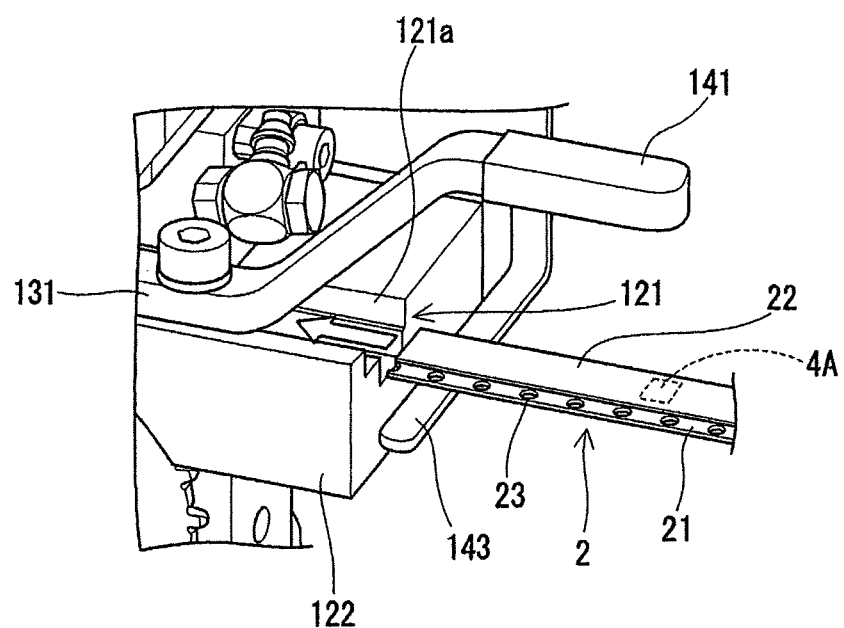
FIG. 7 is a view illustrating an example of the component wrapping tape inserted into the conveyance path of the tape cutting processing apparatus.
Figure 8:
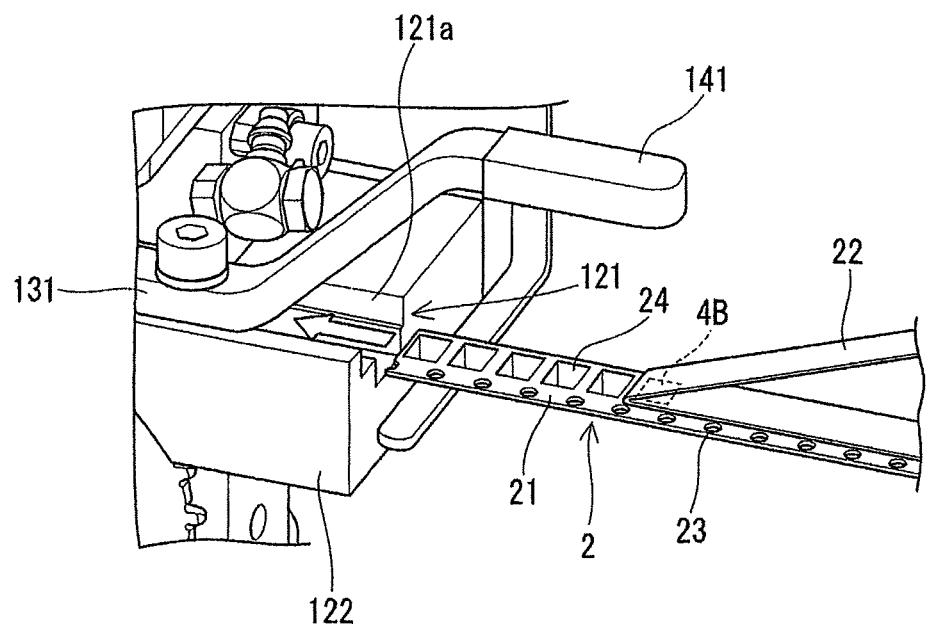
FIG. 8 is a view illustrating a component wrapping tape different from that of FIG. 7 inserted into the conveyance path of the tape cutting processing apparatus.

Here, the component wrapping tape 2 inserted from the insertion port Le is a case of a new tape in which the cover tape 22 is not peeled off from the carrier tape 21 as illustrated in FIG. 7, and a case of a used tape in which the cover tape 22 is peeled off from the carrier tape 21 up to a leading component as illustrated in FIG. 8. The tape cutting processing apparatus 110 in the embodiment can cope with either case. Moreover, in FIGS. 7 and 8, 4A and 4B indicate the leading components respectively accommodated in the cavities 24. In the following description, an operation of a case where the component wrapping tape 2 (see FIG. 7), in which the cover tape is not peeled off from the carrier tape 21, is cutting-processed will be described.

In a case where the component wrapping tape 2 is inserted from the insertion port Le, the operation lever 141 is lifted up by the operator and the pushing member 131 is lifted against the biasing force of the biasing members 137 and 138. In this state, the component wrapping tape 2 is inserted from the insertion port Le to a predetermined position of the conveyance path 121 by the operator. Thereafter, when the operation lever 141 is released, the pushing member 131 is lowered by the biasing force of the biasing members 137 and 138. When the pushing member 131 is lowered, the feeding hole 23 portion of the component wrapping tape 2 is pushed against the conveyance reference surface 121b of the conveyance path 121 by the pushing section 132 provided on the upstream side of the pushing member 131 in the tape conveyance direction, and is not separated from the sprocket 123. In addition, when the pushing member 131 is lowered, the peeling member 155 provided on the downstream side of the pushing member 131 in the tape conveyance direction is positioned at a position at which the cover tape 22 is peeled off from the carrier tape 21.

When the component wrapping tape 2 is inserted to a predetermined position of the conveyance path 121, the insertion of the tape is detected by a tape detection sensor (not illustrated) (step S200) and a detection signal is issued. The motor 124 of the conveyance device 120 is actuated (step S202) and the sprocket 123 is driven to rotate based on such a detection signal. Therefore, the component wrapping tape 2 is conveyed along the conveyance path 121 and the cover tape 22 is peeled off from the carrier tape 21 by the scraper 155a of the peeling member 155. As indicated by the two-dotted chain line of FIG. 10, the cover tape 22 which is peeled off from the carrier tape 21 is folded back to the upstream side in the tape conveyance direction along the upper face of the cover tape 22 which is not peeled off.

Figure 12:
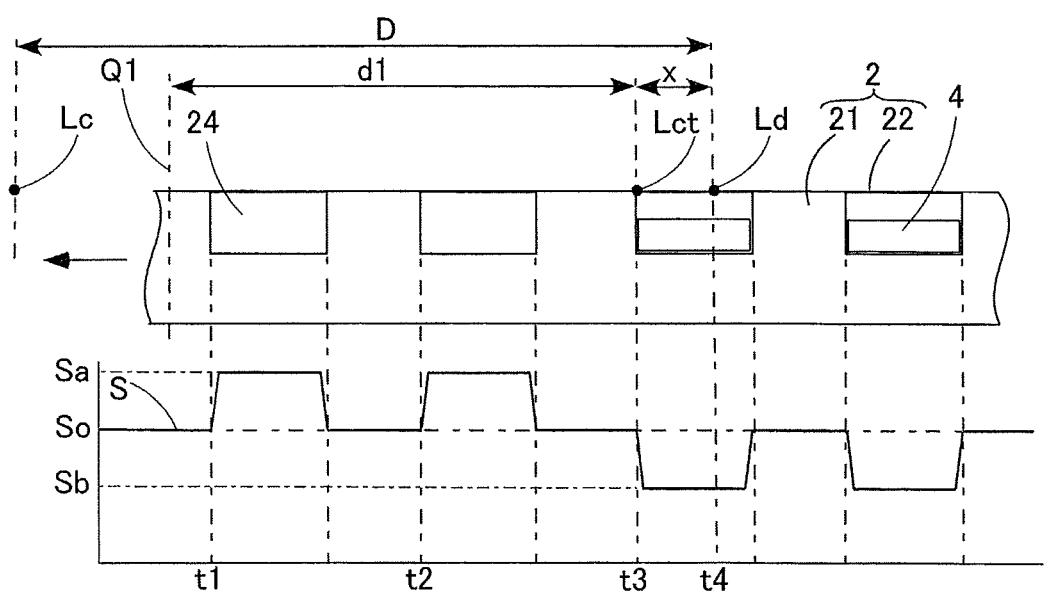
FIG. 12 is a view for explaining a calculation step of a cutting portion of the carrier tape.

As described above, when the component wrapping tape 2 is conveyed along the conveyance path 121, the cavity 24 in which the leading component 4 is accommodated is detected by the detection device 150 provided at the detection position Ld (step S204). As illustrated in FIG. 12, the cutting portion Q1 of the carrier tape 21 is calculated from the distance d1 from the leading end of the carrier tape 21 to the leading component 4 and the distance D between the detection position Ld and the cutting position Lc which are known based on the detection signal (step S206).

That is, as illustrated in FIG. 12, if a detection signal (light quantity) S from the detection device 150 indicates So at a tape portion between the cavities 24 of the component wrapping tape 2, since a transmitted light quantity in the empty cavity 24 in which the component 4 is not present is increased, the detection signal S indicates Sa and since the transmitted light amount in the cavity 24 having the component 4 is decreased, the detection signal S indicates Sb.

Therefore, when transferring from the empty cavity 24 to the cavity 24 having the component 4, the number of pulses of the motor 124 of the conveyance device 120 between a rising time point t3 of the detection signal S at this time and a current time point t4 is counted. A distance x between an illustrated left end position Lct of the cavity 24 having the component 4 and the detection position Ld can be obtained by obtaining a feeding amount of the component wrapping tape 2 based on the count number of the pulses.

The component wrapping tape 2 is conveyed by a distance D−d1−x which is obtained by subtracting the distance d1 from the leading end of the carrier tape 21 to the leading component 4, which is set in advance from the distance D between the detection position Ld and the cutting position Lc which are known, and the distance x. Therefore, the cutting portion Q1 can be positioned at the cutting position Lc. Otherwise, after the component wrapping tape 2 is reversely conveyed by the distance d1+x, the component wrapping tape 2 is conveyed by the distance D. Therefore, the cutting portion Q1 of the carrier tape 21 can be positioned at the cutting position Lc.

When the cavity 24 in which the leading component 4 is accommodated is detected by the detection device 150, the air blow main body 181 of the air blow device 180 is advanced by a predetermined amount by the air cylinder 182 (step S208), the lifting section 181a formed at the leading end of the air blow main body 181 is engaged with the engaging recessed section 131a formed on the lower face of the pushing member 131, and the pushing member 131 is lifted up against the biasing force of the biasing members 137 and 138.

In this case, in the biasing forces of the biasing members 137 and 138, the biasing force of the biasing member 137 on the upstream side in the tape conveyance direction is larger than that of the biasing member 138. Therefore, the pushing member 131 is inclined by the engagement with the lifting section 181a so that the upstream side in the tape conveyance direction is lowered with an engagement point with the lifting section 181a as a fulcrum. Therefore, the peeling member 155 provided on the downstream side of the pushing member 131 in the tape conveyance direction is lifted to be separated from the upper face of the carrier tape 21 and the peeling operation of the cover tape 22 by the peeling member 155 is not performed. However, the pushing operation of the carrier tape 21 by the pushing section 132 provided on the upstream side of the pushing member 131 in the tape conveyance direction is maintained.

On the other hand, when the air blow main body 181 is advanced by the air cylinder 182, the switching valve (not illustrated) is switched and the pressurized air is ejected from the air blow hole 183 toward the downstream side in the tape conveyance direction (step S210). As indicated by the solid line of FIG. 10, the cover tape 22, which is peeled off from the carrier tape 21 and is folded back to the upstream side in the tape conveyance direction, is pushed to the downstream side in the tape conveyance direction by ejection of such a pressurized air. Therefore, the leading end portion of the cover tape 22 is overlapped on the upper face of the carrier tape 21 which is peeled off from the cover tape 22.

Figure 15:
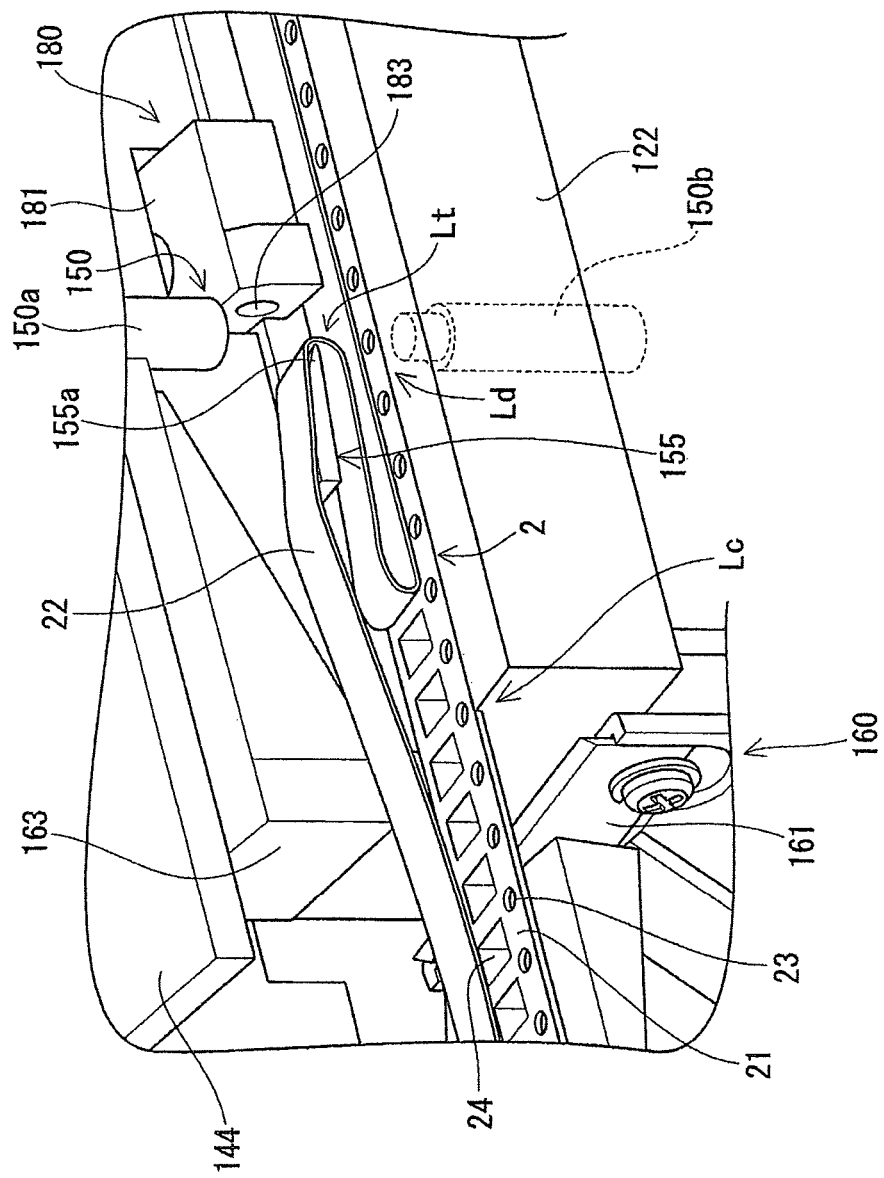
FIG. 15 is an operation state view of FIG. 10 illustrating a folded state of the cover tape.

In this state, the rotation of the motor 124 of the conveyance device 120 is controlled and the component wrapping tape 2 is conveyed by the calculated distance D. When the component wrapping tape 2 is conveyed along the conveyance path 121, the cover tape 22 is not peeled off by the peeling member 155 and the component wrapping tape 2 is conveyed. As illustrated in FIG. 15, the cover tape 22 is folded back by the peeling member 155 in an inverted S shape so that the adhesion surfaces face each other at the folding-back position Lt, and the leading end portion is overlapped on the upper face of the carrier tape 21 which is peeled off from the cover tape 22. Therefore, slackness is imparted to the cover tape 22 with respect to the linear carrier tape 21. In this way, the component wrapping tape 2 is further conveyed by the conveyance device 120 so that the cutting portion Q1 of the carrier tape 21 is positioned at the cutting position Lc (step S212) and the rotation of the motor 124 of the conveyance device 120 is stopped.

When the cutting portion Q1 of the carrier tape 21 is positioned at the cutting position Lc, the air cylinder 162 is operated so that the cutter 161 of the cutting device 160 is lifted and the cutting portion Q1 of the carrier tape 21 which is positioned at the cutting position Lc is cut (step S214). At the same time, the cutting portion Q2 of the cover tape 22 which is overlapped on the upper face of the carrier tape 21 is also cut by the cutter 161.

Figure 16:
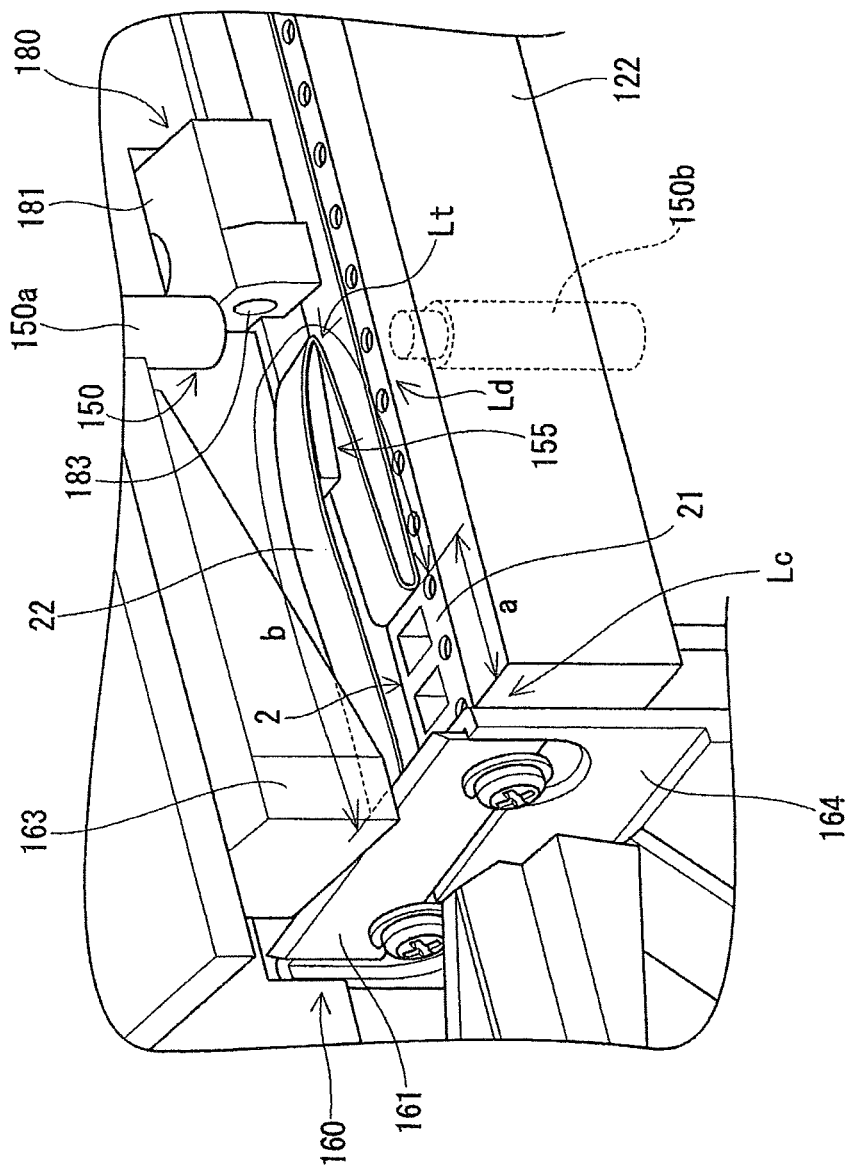
FIG. 16 is an operation state view of FIG. 10 illustrating a cutting state of the carrier tape and the cover tape.

In this case, as illustrated in FIG. 16, the distance from the cutting portion Q1 of the cut carrier tape 21 to the leading component 4 is "a", whereas since the cover tape 22 is folded back so that the adhesion surfaces face each other at the folding-back position Lt, the distance from the cutting portion Q2 to the leading component 4 is "b". A difference (b-a) between both distances from the leading component 4 is the protruding length of the cover tape 22 from the leading end of the carrier tape 21. The protruding length can be set to the targeted protruding length d2 indicated in FIG. 3 by setting the position of the folding-back position Lt.

Moreover, when the carrier tape 21 and the cover tape 22 are cut, the guide member 190 is rotated and held at the angle position at which each of the leading end portions of the carrier tape 21 and the cover tape 22 are guided to the discard positions and, along with this, as illustrated in FIG. 14, the engaging pin 195 and the engaging hook 196 configuring the lock mechanism 193 are engaged, and lifting and lowering of the lifting and lowering block 130 (the supporting plate 144) are mechanically locked.

When the carrier tape 21 and the cover tape 22 are cut, the rotating member 186 is rotated by the air cylinder 188 and as indicated by the two-dotted chain line of FIG. 14, the engaging hook 196 configuring the lock mechanism 193 is separated from the engaging pin 195 and the lock is released. Next, the component wrapping tape 2 which is cutting-processed is conveyed by the conveyance device 120 and is conveyed along the guide 171 of the transfer device 170.

Thereafter, the pushing member 131 is lifted by a predetermined amount together with the lifting and lowering block 130 by the air cylinder 133. Since the lifting and lowering block 130 is lifted and the lifting member 143 is also integrally lifted, the component wrapping tape 2 is lifted by the lifting member 143 and is separated from the guide groove 121a of the conveyance path 121.

Thereafter, the seat 177 of the transfer device 170 is moved by the moving device 178 in the X-direction and the component wrapping tape 2 which is held by the guide 171 of the transfer device 170 is positioned at a position aligned with the tape feeding guide 94 of the tape feeder 90 which is held by the feeder holding stand 10. Thereafter, as described in International Publication No 2014/097473, the carrier tape 21 and the cover tape 22 of the component wrapping tape 2 are respectively set in the pitch feeding mechanism section 93 and the cover tape feeding mechanism section 97 of the tape feeder 90.

The positioning control section 102, which controls positioning of the cutting portion Q1 of the carrier tape 21 at the cutting position Lc by controlling the motor 124 of the conveyance device 120 based on the detection signal from the detection device 150 by the step S212, is configured. In addition, the cutting control section 104, which controls the cutting device so as to simultaneously cut the carrier tape 21 and the cover tape 22 in a state where the carrier tape 21 and the cover tape 22 are positioned to be overlapped on the cutting position Lc by the step S214, is configured.

In the above description, a mode, in which the component wrapping tape 2 illustrated in FIG. 7 in which the cover tape is not peeled off from the carrier tape 21 is cutting-processed, is described, but similarly, the tape cutting processing apparatus 110 according to the embodiment also can perform the cutting processing in the component wrapping tape 2 illustrated in FIG. 8 in which the cover tape is already peeled off from the carrier tape 21 to a predetermined position by being inserted from the insertion port Le of the conveyance block 122 in a state of being illustrated in FIG. 8.

According to the above-described embodiment, the tape cutting processing apparatus 110 includes the conveyance device 120 that conveys the component wrapping tape 2 along the conveyance path 121, the detection device 150 that detects the presence or absence of the component 4 accommodated in the cavity 24 of the component wrapping tape 2 which is conveyed along the conveyance path 121 at the detection position Ld disposed on the conveyance path 121, the peeling member (folding-back member) 155 that peels off the cover tape 22 from the carrier tape 21 and folds back the cover tape 22 at the folding-back position Lt so that the adhesion surfaces of the cover tape 22 face each other as the component wrapping tape 2 is conveyed, the cutting device 160 that cuts each of the cutting portions Q1 and Q2 of the carrier tape 21 and the cover tape 22 on the conveyance path 121 in the cutting position Lc, and the control device 100 that controls each operation of the conveyance device 120 and the cutting device 160. The control device 100 controls the conveyance device 120 based on a detection signal from the detection device 150 to position the carrier tape 21 and the cover tape 22 folded back by the folding-back member 155 in a state of being overlapped on the cutting position Lc, and controls the cutting device 160 to cut the carrier tape 21 and the cover tape 22.

Therefore, it is possible to cut the carrier tape 21 and the cover tape 22 at once by the cutting device 160 so that the leading end of the cover tape 22 protrudes by the predetermined protruding length from the leading end of the carrier tape 21, and it is possible to effectively perform the cutting processing of the tape.

According to the above-described embodiment, the peeling member 155 is held at a position where the cover tape 22 is peeled off until the component 4 accommodated in the cavity 24 of the component wrapping tape 2 is detected by the detection device 150, and is moved to the folding-back position Lt in which peeling of the cover tape 22 is not performed based on the detection of the component 4 accommodated in the cavity 24 of the component wrapping tape 2 by the detection device 150. Therefore, peeling of the cover tape 22 and folding back of the cover tape 22 can be performed by using the common peeling member 155.

According to the above-described embodiment, the air blow device 180, which sprays air to the downstream side in the tape conveyance direction, causes the cover tape 22 peeled off from the carrier tape 21 to pass above the peeling member 155, and feeds the cover tape 22 on the downstream side in the tape conveyance direction, is provided. The air blow device 180 is provided to be capable of advancing and retracting with respect to the conveyance path 121. The air blow device 180 is retracted from the conveyance path 121 until the component 4 accommodated in the cavity 24 of the component wrapping tape 2 is detected by the detection device 150. The air blow device 180 is advanced on the conveyance path 121 based on the detection of the component 4 accommodated in the cavity 24 of the component wrapping tape 2 by the detection device 150.

Therefore, when the carrier tape 21 and the cover tape are cut, the cover tape 22 can be folded back at the folding-back position Lt by the air blow device 180 advanced on the conveyance path 121 so that the adhesion surfaces of the cover tape 22 face each other, and the folded cover tape 22 can be overlapped on the carrier tape 21 at the cutting position Lc.

According to the above-described embodiment, the pushing member 131, which is supported to be capable of lifting and lowering, and inclining on the conveyance block 122 formed with the guide groove 121a for guiding the component wrapping tape 2 to be capable of conveying, and in which two positions spaced in the conveyance direction of the component wrapping tape are biased by the biasing members 137 and 138 having different biasing forces, toward the conveyance block 122, is provided. The peeling member 155 is provided on the downstream side of the pushing member 131 in the tape conveyance direction. The pushing section 132, which pushes the component wrapping tape 2 toward the conveyance reference surface 121b of the guide groove 121a so that the component wrapping tape 2 is not separated from the sprocket 123 of the conveyance device 120 engaged with the feeding hole 23 of the component wrapping tape 2, is provided on the upstream side of the pushing member 131 in the tape conveyance direction. The pushing member is lifted by the lifting section 181a provided in the air blow device 180 by advancing of the air blow device 180 onto the conveyance path 121, thereby allowing the peeling member 155 to move to a position where peeling of the cover tape 22 is not performed while maintaining pushing of the component wrapping tape 2 to the conveyance reference surface 121b by the pushing section 132.

Therefore, the pushing section 132 and one pushing member 131 provided with the peeling member 155 are lifted and lowered so that the peeling member 155 can be moved to the position where peeling of the cover tape 22 is not performed while maintaining pushing of the component wrapping tape 2 to the conveyance reference surface 121b by the pushing section 132. The number of components can be reduced and the configuration can be simplified.

In addition, according to the above-described embodiment, the cutting device 160 includes the cutter 161 which is capable of lifting and lowering and the cutter receiving table 163 with which the leading end of the cutter 161 is in pressed contact. The cutter 161 is in pressed contact with the cutter receiving table 163 to cut the carrier tape 21 and the cover tape 22. Therefore, it is possible to reliably cut the cover tape 22 even if the cover tape 22 is formed of a thin resin film.

Furthermore, according to the above-described embodiment, the cutter receiving table 163 is attached to the lifting and lowering block 130 which is lifted and lowered by the cylinder 133 via the elastic body 165. The guide member 190, which guides the leading end portion of the component wrapping tape 2 to the tape discard position when the tape is cut, is rotatably provided on the downstream side of the cutting position Lc in the tape conveyance direction. The lock mechanism 193 for mechanically locking lifting and lowering of the lifting and lowering block 130 is provided in conjunction with the rotation of the guide member 190 to the position for guiding the component wrapping tape 2 to the tape discard position.

Therefore, regardless of a machining error, an assembly error, or the like, the leading end of the cutter 161 can reliably abut against an entire length on the cutter receiving table 163 and the cutting load acting on the cutter receiving table 163 by pushing of the cutter 161 can be received by the lock mechanism 193.

In the above-described embodiment, the tape cutting processing apparatus 110, which is capable of cutting the component wrapping tape 2 illustrated in FIG. 7 in which the cover tape 22 is not peeled off from the carrier tape 21 and the component wrapping tape 2 illustrated in FIG. 8 in which the cover tape 22 is peeled off from the carrier tape 21, is described.

However, in a case where only the component wrapping tape 2 illustrated in FIG. 8, in which the cover tape 22 is already peeled off from the carrier tape 21, is exclusively cut as the tape cutting processing apparatus 110, the peeling member 155 for peeling off the cover tape 22 from the carrier tape 21 is unnecessary. Therefore, in this case, instead of the peeling member 155, the folding-back member, which has a function of merely folding back the cover tape 22 at the folding-back position Lt so that the adhesion surfaces of the cover tape 22 face each other, may be provided so as to be capable of moving relative to the conveyance path 121.

In addition, in the above-described embodiment, an example, in which the cover tape 22 which is peeled off from the carrier tape 21 is folded back so that the adhesion surfaces face each other by the air blow device 180, is described, but the folding unit causing the adhesion surfaces to face each other is not limited to the air blow device 180, and an unit having a function of pushing the peeled cover tape 22 against the leading end of the carrier tape 21 may be provided.

Thus, the disclosure is not limited to the configurations described in the embodiments, and various forms can be adopted without departing from the gist of the disclosure described in the claims.

INDUSTRIAL APPLICABILITY

The tape cutting processing apparatus and the processing method according to the disclosure are suitable for use in the tape feeder which is detachably mounted on the component mounting machine.

REFERENCE SIGNS LIST

2 . . . component wrapping tape, 4 . . . component, 21 . . . carrier tape, 22 . . . cover tape, 24 . . . cavity, 90 . . . tape feeder, 100 . . . control device, 110 . . . tape cutting processing apparatus, 120 . . . conveyance device, 121 . . . conveyance path, 121a . . . guide groove, 121b . . . conveyance reference surface, 122 . . . conveyance block, 123 . . . sprocket, 130 . . . lifting and lowering block, 131 . . . pushing member, 137, 138 . . . biasing member, 150 . . . detection device, 155 . . . peeling member (folding-back member), 160 . . . cutting device, 161 . . . cutter, 163 . . . cutter receiving table, 165 . . . elastic body, 180 . . . air blow device, 181a . . . lifting section, 190 . . . guide member, 193 . . . lock mechanism, Ld . . . detection position, Lc . . . cutting position, Lt . . . folding-back position

The invention claimed is:

1. A tape cutting processing apparatus which performs cutting processing so that a leading end of a cover tape of a component wrapping tape, which is capable of being wound around a tape reel mounted on a tape feeder, protrudes by a predetermined protruding length from a leading end of a carrier tape, the cover tape being adhered on an upper face side of the carrier tape, in which the carrier tape is provided with cavities accommodating components at fixed pitches, the apparatus comprising:
 a conveyance device that conveys the component wrapping tape along a conveyance path;
 a detection device that detects the presence or absence of the component accommodated in the cavity of the component wrapping tape conveyed along the conveyance path at a detection position disposed on the conveyance path;
 a folding-back member that folds back the cover tape at a folding-back position so that adhesion surfaces of the cover tape face each other as the component wrapping tape is conveyed;
 a cutting device that cuts each cutting portion of the carrier tape and the cover tape at a cutting position disposed on the conveyance path; and
 wherein the tape cutting processing apparatus further comprises an air blow device that sprays air to a downstream side in a tape conveyance direction, causes the cover tape peeled off from the carrier tape to pass above the folding-back member, and feeds the cover tape to the downstream side in the tape conveyance direction, and
 wherein the air blow device is provided to be capable of advancing and retracting with respect to the conveyance path, is retracted from the conveyance path until the component accommodated in the cavity of the component wrapping tape is detected by the detection device, and is advanced on the conveyance path based on the detection of the component accommodated in the cavity of the component wrapping tape by the detection device.

2. The tape cutting processing apparatus according to claim 1,
 wherein the folding-back member is configured with a peeling member that peels off the cover tape from the carrier tape, and
 wherein the peeling member is held at a position where the cover tape is peeled off until the component accommodated in the cavity of the component wrapping tape is detected by the detection device, and is moved to the folding-back position at which peeling of the cover tape is not performed based on the detection of the component accommodated in the cavity of the component wrapping tape by the detection device.

3. The tape cutting processing apparatus according to claim 2, further comprising:
 a pushing member that is capable of being lifted and lowered by a support member, and configured to be inclined on a conveyance block formed with a guide groove for guiding the component wrapping tape, and of which two positions spaced in the conveyance direction of the component wrapping tape are biased by biasing members having different biasing forces, toward the conveyance block,
 wherein the peeling member is provided on the downstream side of the pushing member in the tape conveyance direction,
 wherein a pushing section, which pushes the component wrapping tape toward a conveyance reference surface of the guide groove so that the component wrapping tape is not separated from a sprocket of the conveyance device engaged with a feeding hole of the component wrapping tape, is provided on an upstream side of the pushing member in the tape conveyance direction, and
 wherein the pushing member is lifted by a lifting section provided in the air blow device by advancement of the air blow device onto the conveyance path, thereby allowing the peeling member to move to a position where peeling of the cover tape is not performed while maintaining pushing of the component wrapping tape to the conveyance reference surface by the pushing section.

4. The tape cutting processing apparatus according to claim 1,
 wherein the cutting device includes a cutter which is capable of being lifted and lowered, and a cutter receiving table with which a leading end of the cutter is configured to be moved into pressed contact, and cuts the carrier tape and the cover tape by causing the cutter to be in pressed contact with the cutter receiving table.

5. The tape cutting processing apparatus according to claim 4,
 wherein the cutter receiving table is attached to a lifting and lowering block which is lifted and lowered by a cylinder via an elastic body, wherein a guide member, which guides a leading end portion of the component wrapping tape to a tape discard position when the component wrapping tape is cut, is rotatably provided on the downstream side of the cutting position in the tape conveyance direction, and wherein a lock mechanism for mechanically locking the lifting and lowering of the lifting and lowering block is provided in conjunction with the guide member to at a position for guiding the component wrapping tape to the tape discard position.

6. A tape cutting processing method which performs cutting processing so that a leading end of a cover tape of a component wrapping tape, which is capable of being wound around a tape reel mounted on a tape feeder, protrudes by a predetermined protruding length from a leading end of a carrier tape, the cover tape being adhered on an upper face side of the carrier tape, in which the carrier tape is provided with cavities accommodating components at fixed pitches, the method comprising:

spraying air to a downstream side of the component wrapping tape when the component wrapping tape is conveyed along a conveyance path in a tape conveyance direction, and feeding the cover tape after the cover tape has been peeled off from the carrier tape to the downstream side in the tape conveyance direction, and causing the cover tape to pass above a folding-back member;

when the cover tape is passing above the folding-back member, conveying the component wrapping tape and causing the cover tape to fold back by the folding-back member so that adhesion surfaces of the cover tape face each other; and in a state where the cover tape is folded back by the folding-back member, cutting the carrier tape and the cover tape so that the leading end of the cover tape protrudes by the predetermined protruding length from the leading end of the carrier tape.

* * * * *